US009236485B2

(12) United States Patent
Oh et al.

(10) Patent No.: US 9,236,485 B2
(45) Date of Patent: Jan. 12, 2016

(54) THIN FILM TRANSISTOR SUBSTRATE AND LIQUID CRYSTAL DISPLAY DEVICE USING THE SAME

(75) Inventors: Jae Young Oh, Gyeonggi-do (KR); Jae Kyun Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 221 days.

(21) Appl. No.: 13/162,039

(22) Filed: Jun. 16, 2011

(65) Prior Publication Data

US 2012/0007086 A1   Jan. 12, 2012

(30) Foreign Application Priority Data

Jul. 6, 2010   (KR) .................. 10-2010-0064955

(51) Int. Cl.
| | |
|---|---|
| H01L 29/06 | (2006.01) |
| H01L 31/00 | (2006.01) |
| H01L 29/786 | (2006.01) |
| H01L 51/05 | (2006.01) |
| H01L 29/45 | (2006.01) |
| H01L 29/66 | (2006.01) |
| H01L 27/32 | (2006.01) |
| H01L 29/49 | (2006.01) |
| G02F 1/1368 | (2006.01) |

(52) U.S. Cl.
CPC ........ *H01L 29/78618* (2013.01); *H01L 29/458* (2013.01); *H01L 29/66765* (2013.01); *H01L 51/0508* (2013.01); *G02F 1/1368* (2013.01); *H01L 27/3241* (2013.01); *H01L 27/3244* (2013.01); *H01L 27/3248* (2013.01); *H01L 29/4908* (2013.01)

(58) Field of Classification Search
CPC ............. H01L 27/3241; H01L 27/324; H01L 27/3248; H01L 29/4908; H01L 51/0508; H01L 29/78618; H01L 29/458; H01L 29/66765; G02F 1/13663
USPC ................. 257/59, 72.343, 456, 751, E29.12, 257/E21.373, 27
See application file for complete search history.

(56) References Cited

U.S. PATENT DOCUMENTS

| | | | | |
|---|---|---|---|---|
| 5,365,345 | A | * | 11/1994 | Propst ..................... C23C 16/01 359/359 |
| 6,083,829 | A | | 7/2000 | Lai et al. |
| 7,642,552 | B2 | | 1/2010 | Koike et al. |
| 8,259,275 | B2 | | 9/2012 | Suzuki et al. |
| 2004/0263706 | A1 | * | 12/2004 | Cho et al. ......................... 349/43 |
| 2005/0243263 | A1 | * | 11/2005 | Yoon .............................. 349/156 |
| 2006/0019482 | A1 | * | 1/2006 | Su et al. ........................ 438/618 |

(Continued)

FOREIGN PATENT DOCUMENTS

| | | |
|---|---|---|
| JP | 2010/066529 A | 3/2010 |
| KR | 10-2007-0107677 A | 11/2007 |

*Primary Examiner* — Galina Yushina
(74) *Attorney, Agent, or Firm* — Dentons US LLP (57) ABSTRACT

A thin film transistor substrate with an adhesive strength between a semiconductor layer and a source electrode, and between a semiconductor layer and a drain electrode; and an LCD device using the thin film transistor substrate. The thin film transistor substrate includes a substrate, a gate electrode on the substrate, a gate insulating film on the gate electrode, an active layer on the gate insulating film, an ohmic contact layer on the active layer, a barrier layer on the ohmic contact layer. The barrier layer is formed of a material layer containing Ge. A source electrode and a drain electrode are on the barrier layer. The source and drain electrodes are provided at a predetermined interval from each other.

4 Claims, 7 Drawing Sheets

(56) References Cited

U.S. PATENT DOCUMENTS

2006/0118869 A1 6/2006 Lan et al.
2006/0237746 A1* 10/2006 Orlowski ............ H01L 29/165
  257/192
2008/0136029 A1* 6/2008 Liu et al. ...................... 257/751
2009/0017230 A1* 1/2009 Tudhope ............. C23C 16/0272
  427/576
2009/0140323 A1* 6/2009 Fazan ........................... 257/324
2010/0123198 A1* 5/2010 Kim et al. ..................... 257/377
2010/0155952 A1* 6/2010 Koike et al. ................... 257/751

* cited by examiner

[ Related Art ]

THIN FILM TRANSISTOR SUBSTRATE AND LIQUID CRYSTAL DISPLAY DEVICE USING THE SAME

CROSS REFERENCE TO RELATED APPLICATIONS

This application claims the benefit of Korean Patent Application No. 10-2010-0064955 filed on Jul. 6, 2010, which is hereby incorporated by reference as if fully set forth herein.

BACKGROUND OF THE INVENTION

1. Field of the Invention

The present invention relates to a thin film transistor substrate, and more particularly, to a thin film transistor substrate with an invert-staggered structure.

2. Discussion of the Related Art

A thin film transistor is widely used as a switching device of a display device such as a liquid crystal display (LCD) device or an organic light emitting device (OLED).

The thin film transistor comprises a gate electrode, a semiconductor layer, a source electrode and a drain electrode. Based on an arrangement of the electrodes, the thin film transistor may be classified into a staggered structure and a coplanar structure.

In the staggered structure, the gate electrode and the source and drain electrodes are arranged in the upper and lower portions with respect to a semiconductor layer. Meanwhile, the coplanar structure is provided with the gate electrode and the source and drain electrodes arranged in the same plane. Also, the staggered structure may be classified into a normal staggered structure and an invert-staggered structure. In case of the invert-staggered structure, the gate electrode is arranged in the lower portion, and the source and drain electrodes are arranged in the upper portion. In case of the normal staggered structure, the gate electrode is arranged in the upper portion, and the source and drain electrodes are arranged in the lower portion. Generally, the staggered structure, especially the invert-staggered structure allows a decrease in the number of processes and improved interfacial properties, whereby the invert-staggered structure is generally used for the mass production.

Hereinafter, a related art thin film transistor substrate with invert-staggered structure (hereinafter, abbreviated as 'thin film transistor substrate') will be described with reference to the accompanying drawings.

Figure 1:
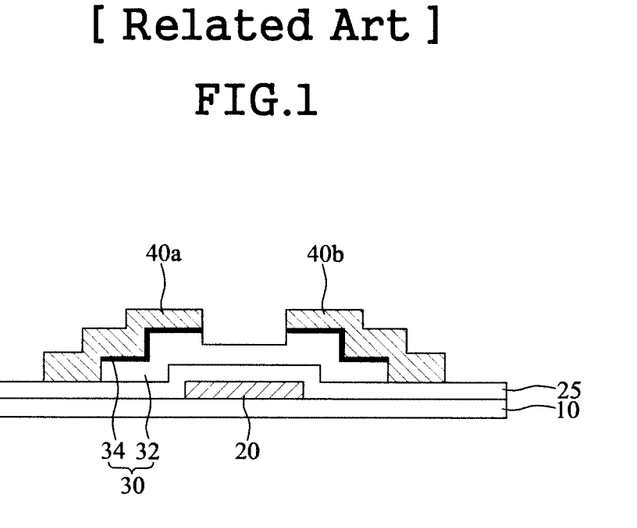
FIG. 1 is a cross section view illustrating a related art thin film transistor substrate.

FIG. 1 is a cross section view illustrating a related art thin film transistor substrate.

As shown in FIG. 1, the related art thin film transistor substrate comprises a substrate 10, a gate electrode 20, a gate insulating film 25, a semiconductor layer 30, a source electrode 40a, and a drain electrode 40b.

The gate electrode 20 is patterned on the substrate 10, and the gate insulating film 25 is formed on an entire surface of the substrate 10 including the gate electrode 20.

The semiconductor layer 30 is patterned on the gate insulating film 25. The semiconductor layer 30 comprises an active layer 32 which is not doped with impurity ions, and an ohmic contact layer 34 which is doped with impurity ions. The active layer 32 is formed on the gate insulating film 25, whereby the active layer 32 functions as a charge drift channel. The ohmic contact layer 34 is formed in an interfacial region between the source electrode 40a and the drain electrode 40b, to thereby lower a charge drift barrier.

The source and drain electrodes 40a and 40b are formed on the semiconductor layer 30 while being provided at a predetermined interval from each other.

However, the related art thin film transistor substrate has a problem of low adhesive strength between the semiconductor layer 30 and the source electrode 40a, and between the semiconductor layer 30 and the drain electrode 40b. That is, because the ohmic contact layer 34 of the semiconductor layer 30 is generally formed of amorphous silicon, and the source and drain electrodes 40a and 40b are formed of metal such as copper Cu, the low adhesive strength between the semiconductor layer 30 and the source and drain electrodes 40 and 40b causes deterioration of the thin film transistor.

SUMMARY OF THE INVENTION

Accordingly, the present invention is directed to a thin film transistor substrate and an LCD device using the same that substantially obviates one or more problems due to limitations and disadvantages of the related art.

An aspect of the present invention is to provide a thin film transistor substrate which improves an adhesive strength between a semiconductor layer and a source electrode, and between a semiconductor layer and a drain electrode; and an LCD device using the thin film transistor substrate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a thin film transistor substrate comprising: a substrate; a gate electrode on the substrate; a gate insulating film on the gate electrode; an active layer on the gate insulating film; an ohmic contact layer on the active layer; a barrier layer on the ohmic contact layer, wherein the barrier layer is formed of a material layer containing Ge; and a source electrode and a drain electrode on the barrier layer, wherein the source and drain electrodes are provided at a predetermined interval from each other.

In another aspect of the present invention, there is provided a thin film transistor substrate comprising: a substrate; a gate electrode on the substrate; a gate insulating film on the gate electrode; an active layer on the gate insulating film; an interface layer on the active layer, wherein the interface layer is formed of a material layer containing Ge; and a source electrode and a drain electrode on the barrier layer, wherein the source and drain electrodes are provided at a predetermined interval from each other.

In another aspect of the present invention, there is provided an LCD device comprising: first and second substrates; and a liquid crystal layer between the first and second substrates, wherein the first substrate is formed of the thin film transistor substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a thin film transistor substrate according to the present invention and an LCD device using the same will be described with reference to the accompanying drawings.

Figure 2:
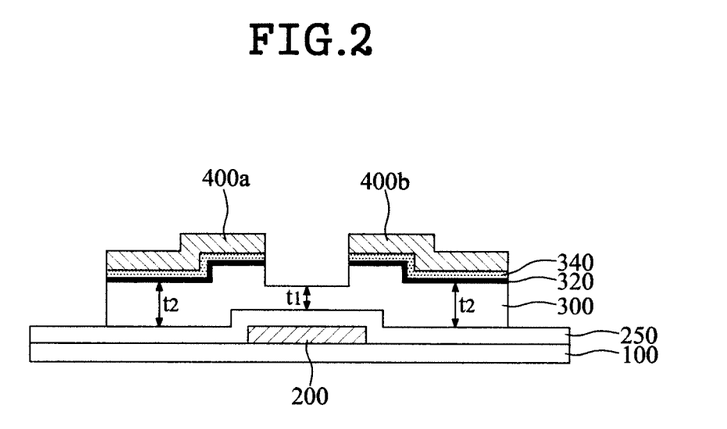
FIG. 2 is a cross section view illustrating a thin film transistor substrate according to one embodiment of the present invention.

FIG. 2 is a cross section view illustrating a thin film transistor substrate according to one embodiment of the present invention. FIGS. 3A to 3G are cross section views illustrating a method for manufacturing a thin film transistor substrate according to one embodiment of the present invention.

As shown in FIG. 2, the thin film transistor substrate according to one embodiment of the present invention comprises a substrate 100, a gate electrode 200, a gate insulating film 250, an active layer 300, an ohmic contact layer 320, a barrier layer 340, a source electrode 400a, and a drain electrode 400b.

The substrate 100 may be formed of a transparent material such as glass or transparent plastic.

The gate electrode 200 is patterned on the substrate 100. The gate electrode 200 may be formed of metal material such as molybdenum (Mo), aluminum (Al), chrome (Cr), aurum (Au), titanium (Ti), nickel (Ni), neodymium (Nd), copper (Cu), or their alloys. The gate electrode 200 may be formed in a single-layered structure comprising a layer of any one among the aforementioned metal materials, or may be formed of a multi-layered structure comprising two or more layers of the aforementioned metal materials.

The gate insulating film 250 is formed on an entire surface of the substrate 100 including the gate electrode 200. The gate insulating film 250 may be formed of silicon oxide (SiOx) or silicon nitride (SiNx). The gate insulating film 250 may be formed in a single-layered structure comprising a layer of silicon oxide (SiOx) or silicon nitride (SiNx), or may be formed of a multi-layered structure comprising two or more layers.

The active layer 300 is patterned on the gate insulating film 250. Particularly, the active layer 300 provided above the gate electrode 200 functions as a charge drift channel. The active layer 300 may be formed of a semiconductor material such as amorphous silicon (a-Si).

The ohmic contact layer 320 is formed on the active layer 300. The ohmic contact layer 320 may be obtained by doping a semiconductor material with impurity ions, for example, group V elements in the periodic table such as phosphorous (P). Thus, the ohmic contact layer 320 may be formed of amorphous silicon (a-Si) doped with phosphorous (P).

The barrier layer 340 is formed between the ohmic contact layer 320 and the source electrode 400a. The barrier layer 340 enhances an adhesive strength between the ohmic contact layer 320 and the source electrode 400a. Also, the barrier layer 340 is formed between the ohmic contact layer 320 and the drain electrode 400b, to thereby enhance an adhesive strength between the ohmic contact layer 320 and the drain electrode 400b.

The barrier layer 340 may be formed of MoTi, Ti, Mo, CuN, Ge, GeSi, or GeC. Preferably, the barrier layer 340 is formed of the material containing Ge, for example, Ge, GeSi, and GeC. This is because an etching speed of the material containing Ge is relatively faster than other materials. Thus, if the barrier layer 340 is formed of the material containing Ge, it allows an improvement of yield. Preferably, the barrier layer 340 has a thickness of about 100~500 Å. If the thickness of the barrier layer 340 is less than 100 Å, the adhesive strength may be deteriorated. Meanwhile, if the thickness of the barrier 340 is more than 500 Å, the yield may be deteriorated.

According to one embodiment of the present invention, the barrier layer 340 is formed in the same pattern as the ohmic contact layer 320. Also, the barrier layer 340 may be formed in the same pattern as the entire pattern of the source and drain electrodes 400a and 400b. That is, the barrier layer 340, the ohmic contact layer 320, and the source and drain electrodes 400a and 400b may be formed in the same pattern.

Except that the active layer 300 is additionally formed between the source electrode 400a and the drain electrode 400b, the active layer 300 is formed in the same pattern as the ohmic contact layer 320. Also, the active layer 300 is formed in such a manner that a thickness (t1) of the channel region between the source electrode 400a and the drain electrode 400b is smaller than a thickness (t2) of the other regions.

The detailed patterns of the active layer 300, the ohmic contact layer 320, the barrier layer 340, and the source and drain electrodes 400a and 400b would be easily understood with the following explanation for manufacturing process.

When the source and drain electrodes 400a and 400b are formed on the barrier layer 340, the source electrode 400a is provided at a predetermined interval from the drain electrode 400b. The source and drain electrodes 400a and 400b may be formed of metal material such as molybdenum (Mo), aluminum (Al), chrome (Cr), aurum (Au), titanium (Ti), nickel (Ni), neodymium (Nd), copper (Cu), or their alloys. Also, each of the source and drain electrodes 400a and 400b may be formed in a single-layered structure comprising a layer of any one among the aforementioned metal materials, or may be formed of a multi-layered structure comprising two or more layers of the aforementioned metal materials.

A method for manufacturing the thin film transistor substrate according to one embodiment of the present invention will be explained as follows.

Figure 3A:
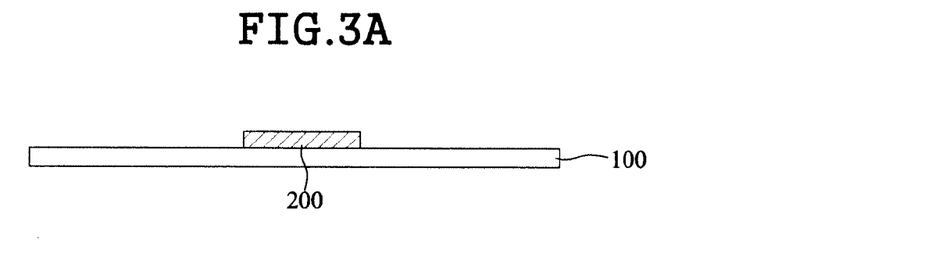
FIGS. 3A to 3G are cross section views illustrating a method for manufacturing a thin film transistor substrate according to one embodiment of the present invention.

First, as shown in FIG. 3A, the gate electrode 200 is patterned on the substrate 100. The gate electrode 200 may be obtained by steps of depositing a metal layer of molybdenum (Mo), and patterning the deposited metal layer by a photolithography using a photo-mask.

Figure 3B:
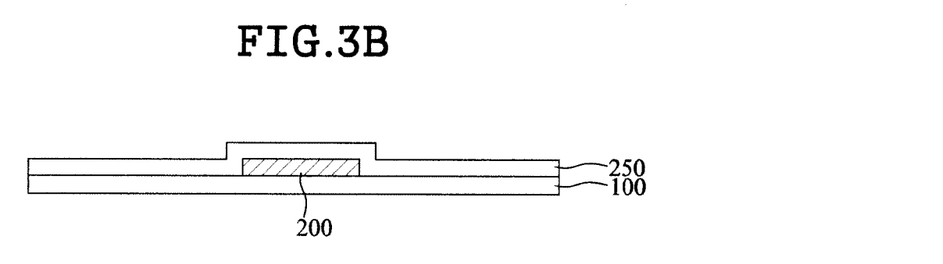

Then, as shown in FIG. 3B, the gate insulating film 250 is formed on the entire surface of the substrate 100 including the gate electrode 200. The gate insulating film 250 may be formed of silicon oxide (SiOx) or silicon nitride (SiNx) by PECVD (Plasma Enhanced Chemical Vapor Deposition).

Figure 3C:
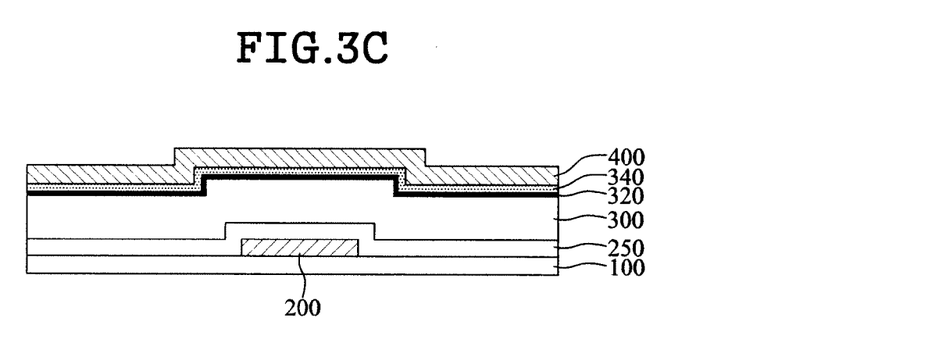

As shown in FIG. 3C, the active layer 300, the ohmic contact layer 320, the barrier layer 340, and a metal layer 400 for the source and drain electrodes are sequentially formed on the gate insulating film 250. The active layer 300 may be formed of amorphous silicon by PECVD; the ohmic contact layer 320 may be formed of amorphous silicon doped with phosphorous (P) by PECVD; the barrier layer 340 may be formed of the aforementioned material by PECVD or sputtering; and the metal layer 400 for source and drain electrodes may be formed of the aforementioned metal by sputtering.

Preferably, the barrier layer 340 is formed by depositing the material containing Ge at 100~500 Å thickness. Also, the barrier layer 340 may be formed by PECVD using GeH4 and H2, which enables a reduced manufacturing cost in comparison to the sputtering method.

Figure 3D:
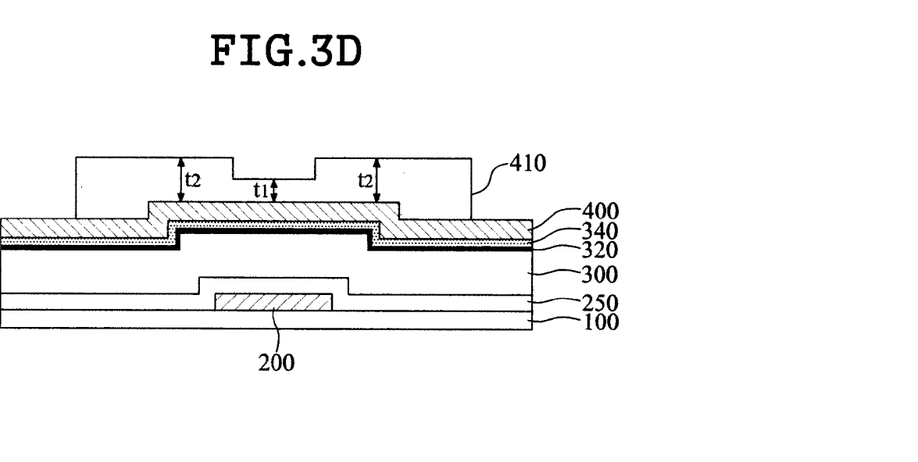

As shown in FIG. 3D, a photoresist pattern 410 is formed on the metal layer 400 for the source and drain electrodes. By the use of half-tone mask, the photoresist pattern 410 includes a relatively-thin region (t1) and a relatively-thick region (t2).

Figure 3E:
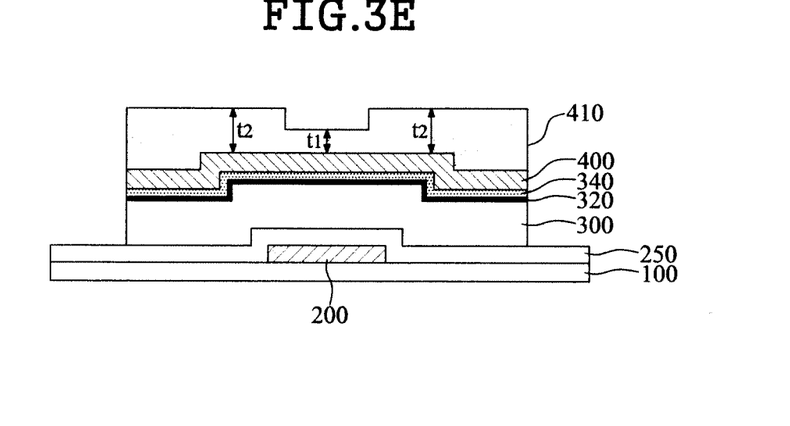

As shown in FIG. 3E, under the circumstances that the photoresist pattern 410 is used as a mask; the metal layer 400 for source and drain electrodes, the barrier layer 340, the ohmic contact layer 320, and the active layer 300 are etched in sequence. Herein, the metal layer 400 for source and drain electrodes, and the barrier layer 340 may be etched by a wet-etching process; and the ohmic contact layer 320 and the active layer 300 may be etched by a dry-etching process.

As mentioned above, if the barrier layer 340 is formed of the material containing Ge, the wet-etching process can be shortened in comparison to the case using the other materials. In more detail, if the metal layer 400 for source and drain electrodes is formed of Cu, and the barrier layer 340 is formed of MoTi, the time consumed for the wet-etching process is about 110 seconds, based on the experimental results. Meanwhile, if the metal layer 400 for source and drain electrodes is formed of Cu, and the barrier layer 340 is formed of the material containing Ge, the time consumed for the wet-etching process is about 80 seconds.

Figure 3F:
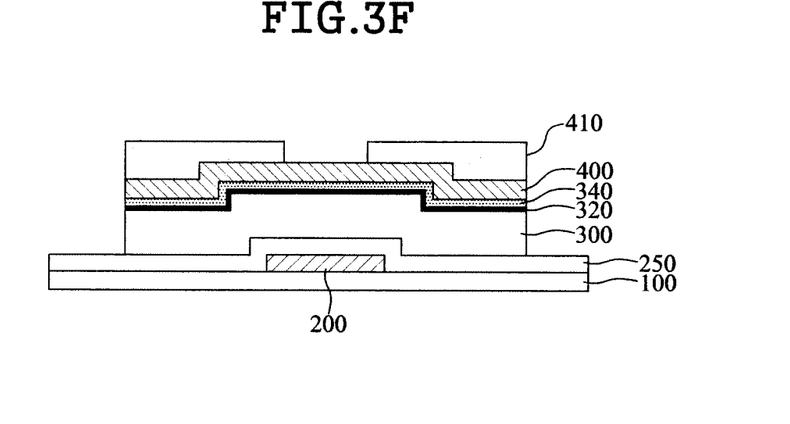

As shown in FIG. 3F, the photoresist pattern 410 is ashed so that the relatively-thin region (t1) of the photoresist pattern 410 is removed as and the relatively-thick region (t2) of the photoresist pattern 410 remains.

Figure 3G:
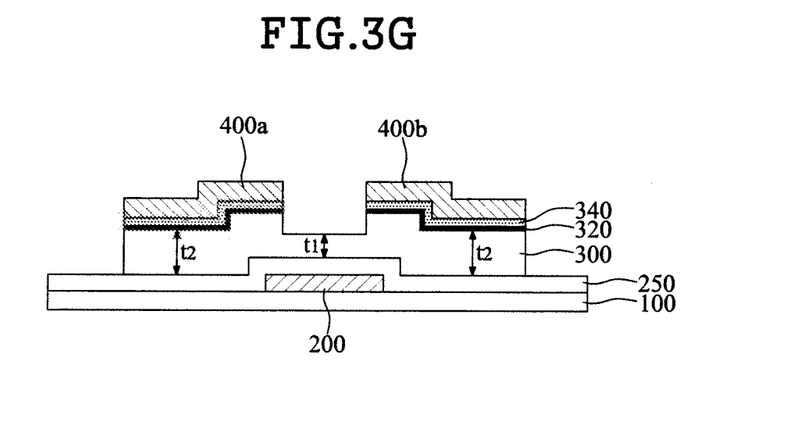

As shown in FIG. 3G, under the circumstances that the remaining photoresist pattern 410 is used as a mask; the metal layer 400 for source and drain electrodes, the barrier layer 340 and the ohmic contact layer 320, which are provided in the channel region, are etched sequentially, and then the photoresist pattern 410 is removed to thereby form the source and drain electrodes 400a and 400b which are provided at the predetermined interval from each other.

The metal layer 400 for source and drain electrodes, and the barrier layer 340 may be etched by the wet-etching process; and the ohmic contact layer 320 may be etched by the dry-etching process. As mentioned above, if the barrier layer 340 is formed of the material containing Ge, the time consumed for the wet-etching process can be shortened.

If etching the ohmic contact layer 320 of the channel region, the active layer 300 under the ohmic contact layer 320 may be etched at a predetermined depth together with the ohmic contact layer 320. Thus, the active layer 300 is formed in such a manner that the thickness (t1) of the channel region between the source electrode 400a and the drain electrode 400b is smaller than the thickness (t2) of the other regions.

When etching the ohmic contact layer 320 of the channel region, the active layer 300 is etched together with the ohmic contact layer 320. This is because the impurity ions doped for forming the ohmic contact layer 320 in the aforementioned process of FIG. 3C might be diffused to the upper side of the active layer 300, thereby a leakage current may be increased due to the diffused impurity ions.

Although not shown, a passivation film may be additionally formed on the entire surface of the substrate 100 including the source and drain electrodes 400a and 400b, and a pixel electrode may be additionally formed on the passivation film. At this time, a contact hole is formed in the passivation film, and the pixel electrode is electrically connected with the drain electrode 400b via the contact hole. This would be easily understood with the following explanation for an LCD device.

Figure 4:
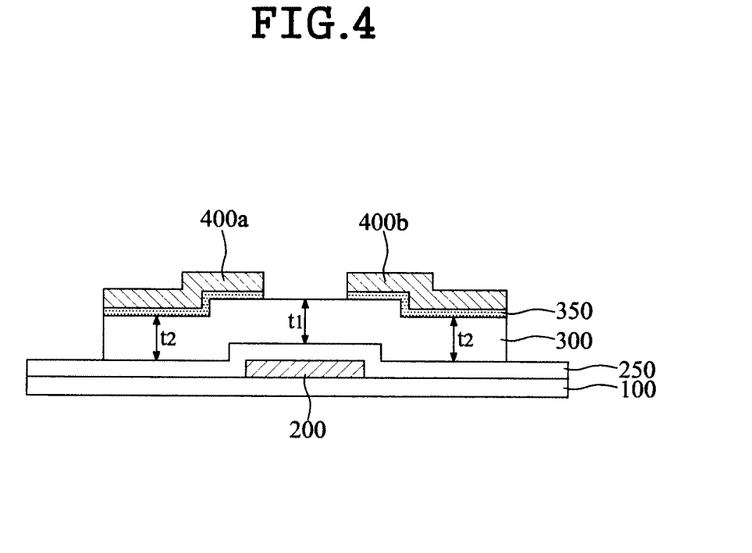
FIG. 4 is a cross section view illustrating a thin film transistor substrate according to another embodiment of the present invention.

FIG. 4 is a cross section view illustrating a thin film transistor substrate according to another embodiment of the present invention. FIGS. 5A to 5G are cross section views illustrating a method for manufacturing a thin film transistor substrate according to another embodiment of the present invention. Hereinafter, a detailed explanation for the same parts as those of the aforementioned embodiment will be omitted.

As shown in FIG. 4, the thin film transistor substrate according to another embodiment of the present invention includes a substrate 100, a gate electrode 200, a gate insulating film 250, an active layer 300, an interface layer 350, a source electrode 400a, and a drain electrode 400b.

The gate electrode 200 is patterned on the substrate 100. The gate insulating film 250 is formed on an entire surface of the substrate 100 including the gate electrode 200. The active layer 300 is patterned on the gate insulating film 250.

The interface layer 350 is formed on the active layer 300. Especially, the interface layer 350 is formed between the active layer 300 and the source electrode 400a, and between the active layer 300 and the drain electrode 400b.

The interface layer 350 functions as the aforementioned ohmic contact layer 320 and the barrier layer 340 of the thin film transistor substrate shown in FIG. 2. That is, the interface layer 350 lowers a charge drift barrier, and simultaneously enhances an adhesive strength. For improving the yield by a rapid etching speed, the interface layer 350 is formed of a material containing Ge, for example, Ge, GeSi or GeC, preferably. It is more preferable that the interface layer 350 be formed of a material containing Ge doped with impurity ions such as phosphorous (P) to thereby enhance the function of lowering the charge drift barrier.

Preferably, the interface layer 350 has a thickness of about 100~500 Å. If the thickness of the interface layer 350 is less than 100 Å, the function of lowering the charge drift barrier and enhancing the adhesive strength may be deteriorated. Meanwhile, if the thickness of the interface layer 350 is more than 500 Å, the yield may be deteriorated.

According to another embodiment of the present invention, the pattern of the interface layer 350 may be the same as the entire pattern of the source and drain electrodes 400a and 400b. Also, the active layer 300 is formed in the same pattern as the interface layer 350 except that the active layer 300 is additionally formed in the channel region, that is, the region between the source electrode 400a and the drain electrode 400b. Also, the active layer 300 is formed in such a manner that a thickness (t1) of the channel region between the source electrode 400a and the drain electrode 400b is substantially the same as a thickness (t2) of the other regions. The detailed patterns of the active layer 300, the interface layer 350, and the source and drain electrodes 400a and 400b would be easily understood with the following explanation for the manufacturing process.

The source and drain electrodes 400a and 400b are formed on the interface layer 350.

A method for manufacturing the thin film transistor substrate according to another embodiment of the present invention will be explained as follows. A detailed explanation for the same parts as those of the aforementioned embodiment will be omitted.

Figure 5A:
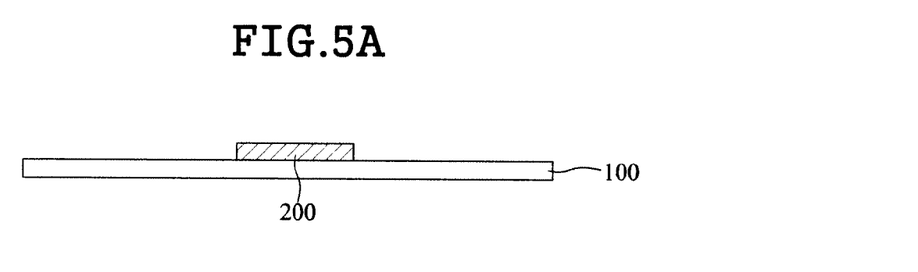
FIGS. 5A to 5G are cross section views illustrating a method for manufacturing a thin film transistor substrate according to another embodiment of the present invention.

First, as shown in FIG. 5A, the gate electrode 200 is patterned on the substrate 100.

Figure 5B:
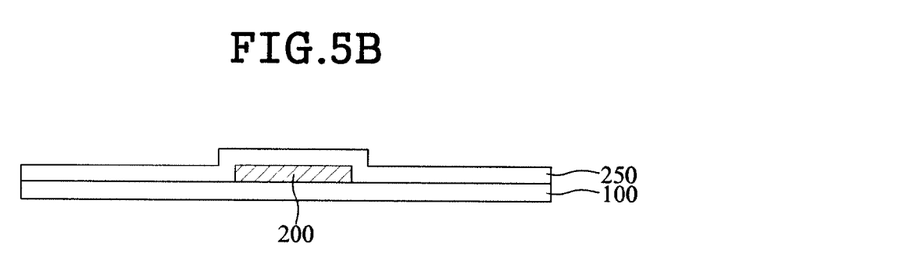

Then, as shown in FIG. 5B, the gate insulating film 250 is formed on the entire surface of the substrate 100 including the gate electrode 200.

Figure 5C:
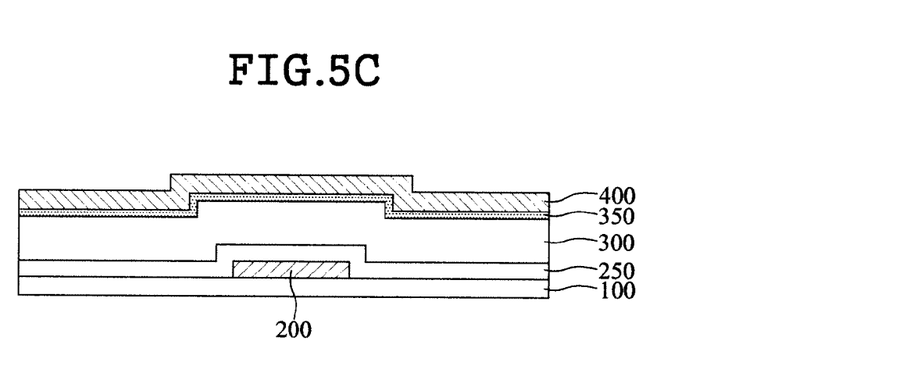

As shown in FIG. 5C, the active layer 300, the interface layer 350, and a metal layer 400 for the source and drain electrodes are sequentially formed on the gate insulating film 250.

The active layer 300 may be formed of amorphous silicon by PECVD; the interface layer 350 may be formed of the aforementioned material by PECVD; and the metal layer 400 for the source and drain electrodes may be formed of the aforementioned metal by sputtering.

Preferably, the interface layer 350 is formed by depositing the material containing Ge doped with impurity ions at 100~500 Å thickness. In more detail, the interface layer 350 may be formed using GeH4, H2 or PH3 by PECVD.

Figure 5D:
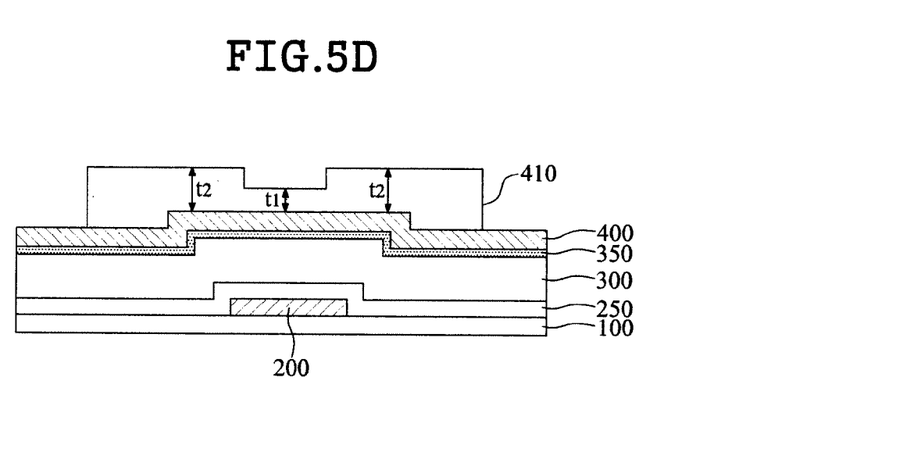

Then, as shown in FIG. 5D, a photoresist pattern 410 is formed on the metal layer 400 for the source and drain electrodes.

Figure 5E:
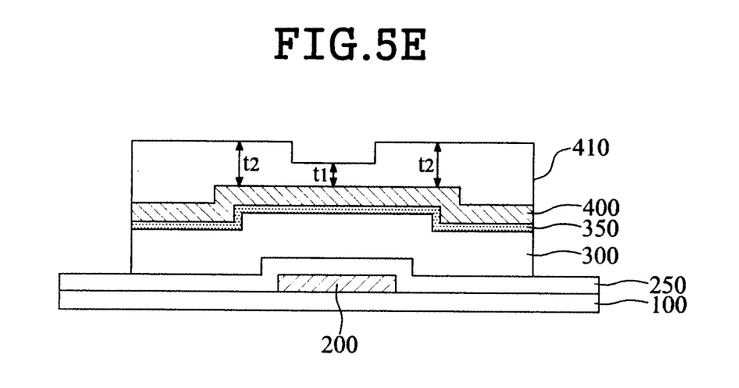

As shown in FIG. 5E, under the circumstances that the photoresist pattern 410 is used as a mask; the metal layer 400 for source and drain electrodes, the interface layer 350, and the active layer 300 are etched in sequence. Herein, the metal layer 400 for source and drain electrodes, and the interface layer 350 may be etched by a wet-etching process; and the active layer 300 may be etched by a dry-etching process.

Figure 5F:
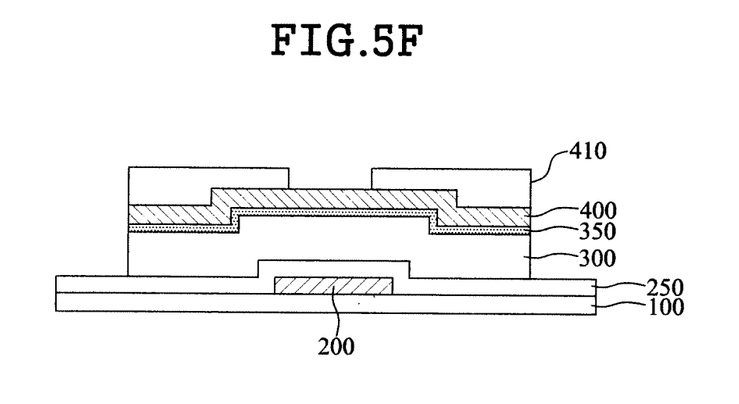

As shown in FIG. 5F, the photoresist pattern 410 is ashed.

Figure 5G:
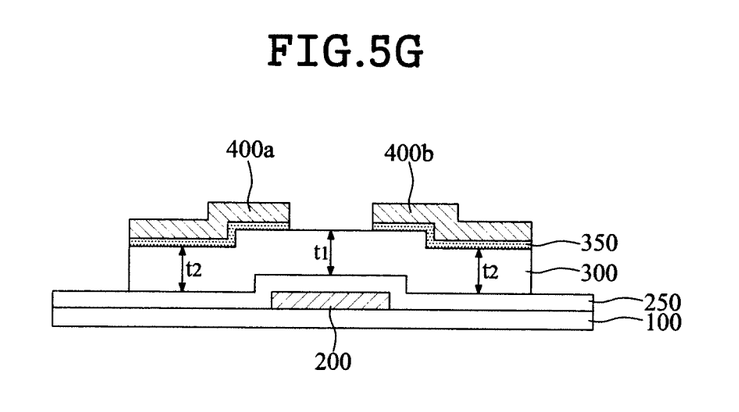

As shown in FIG. 5G, under the circumstances that the remaining photoresist pattern 410 is used as a mask; the metal layer 400 for source and drain electrodes, and the interface layer 350, which are provided in the channel region, are etched sequentially, and then the photoresist pattern 410 is removed to thereby form the source and drain electrodes 400a and 400b which are provided at the predetermined interval from each other.

The metal layer 400 for source and drain electrodes, and the interface layer 350 may be etched by the dry-etching process.

Unlike the aforementioned embodiment, when etching the interface layer 350 of the channel region, the active layer 300 positioned under the interface layer 350 is not etched. Thus, the active layer 300 is formed in such a manner that the thickness (t1) of the channel region between the source electrode 400a and the drain electrode 400b is substantially the same as the thickness (t2) of the other regions.

In this embodiment of the present invention, the impurity ions are scarcely diffused to the active layer 300 during the process for forming the interface layer 350, and the interface layer 350 is etched together with the source and drain electrodes 400a and 400b during the process for etching the source and drain electrodes 400a and 400b. Thus, there is no need to etch the active layer 300 positioned under the interface layer 350 when etching the interface layer 350 of the channel region. In comparison to the aforementioned embodiment, the active layer 300 can be relatively thinner so that the time consumed for the deposition process of the active layer 300 is shortened, and a current path is decreased due to the thin active layer 300, to thereby improve the device properties.

Figure 6:
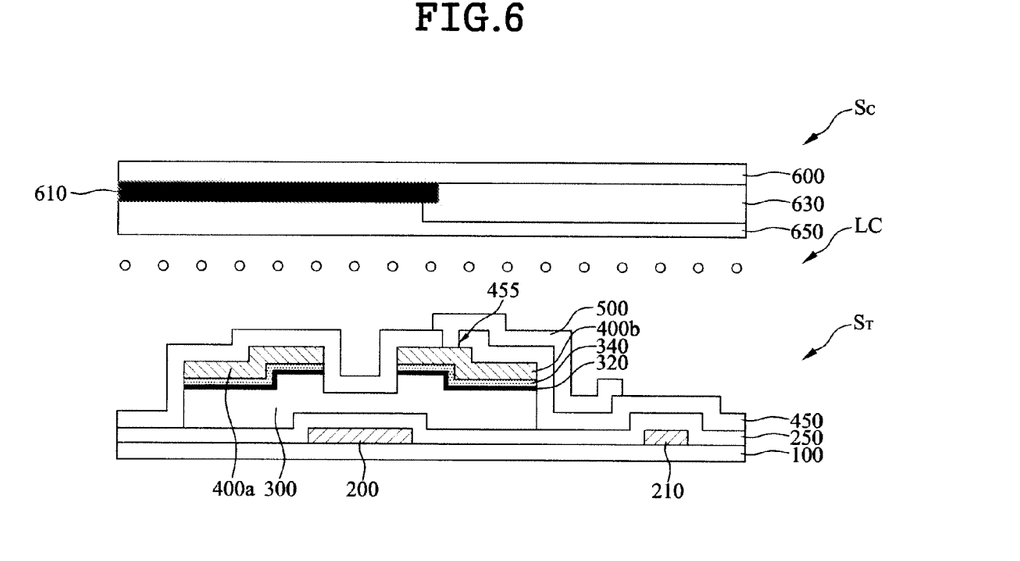
FIG. 6 is a cross section view illustrating an LCD device according to one embodiment of the present invention.

FIG. 6 is a cross section view illustrating an LCD device according to one embodiment of the present invention, to which the thin film transistor substrate of FIG. 2 is applied. Thus, the same reference numbers will be used throughout the drawings to refer to the same or like parts, and a detailed explanation for the same parts will be omitted.

As illustrated in FIG. 6, the LCD device according to one embodiment of the present invention comprises a thin film transistor substrate (ST), a color filter substrate (SC), and a liquid crystal layer (LC) between the two substrates.

On the thin film transistor substrate (ST), there are a gate electrode 200, a gate insulating film 250, an active layer 300, an ohmic contact layer 320, a barrier layer 340, a source electrode 400a, and a drain electrode 400b on a first substrate 100. These are the same as those shown in FIG. 2.

A passivation film 450 is formed on an entire surface of the first substrate 100 including the source electrode 400a and the drain electrode 400b. A contact hole 455 is formed in the passivation film 450, whereby the drain electrode 400b is exposed via the contact hole 344. The passivation film 450 may be formed of an inorganic-based material such as silicon oxide or silicon nitride, or may be formed of an organic-based material such as acryl.

Also, a pixel electrode 500 is formed on the passivation film 450. The pixel electrode 500 is electrically connected with the drain electrode 400b via the contact hole 455. The pixel electrode 500 may be formed of a transparent conductive material such as ITO.

Also, a common electrode 210 is formed in the same layer as the gate electrode 200. The common electrode 210 together with the pixel electrode 500 generates an In-Plane electric field to thereby drive liquid crystal. As shown in the drawings, the common electrode 210 may be formed in the same layer as the gate electrode 200, but not necessarily. The common electrode 210 may vary in position. For example, the common electrode 210 may be formed in the same layer as the pixel electrode 500.

In addition to an In-Plane Switching mode where the common electrode 210 and the pixel electrode 500 are formed on the same substrate, there may be Twisted Nematic (TN) and Vertical Alignment (VA) modes where the common electrode 210 and the pixel electrode 500 are formed on the different substrates. In case of TN and VA modes, the common electrode 210 may be formed on the color filter substrate (SC).

On the color filter substrate (SC), there are a light-shielding layer 610, a color filter layer 630, and an overcoat layer 650. In this case, the light-shielding layer 610 is formed on a second substrate 600; the color filter layer 630 is formed on the light-shielding layer 610; and the overcoat layer 650 is formed on the color filter layer 630.

The light-shielding layer 610 prevents light from leaking in the other regions except the pixel region, wherein the light-shielding layer 610 is patterned in a matrix structure. The color filter layer 630 comprises red (R), green (G), and blue (B) color filters respectively interposed between each light-shielding layer 610. The overcoat layer 650 is formed on an entire surface of the second substrate 600.

Figure 7:
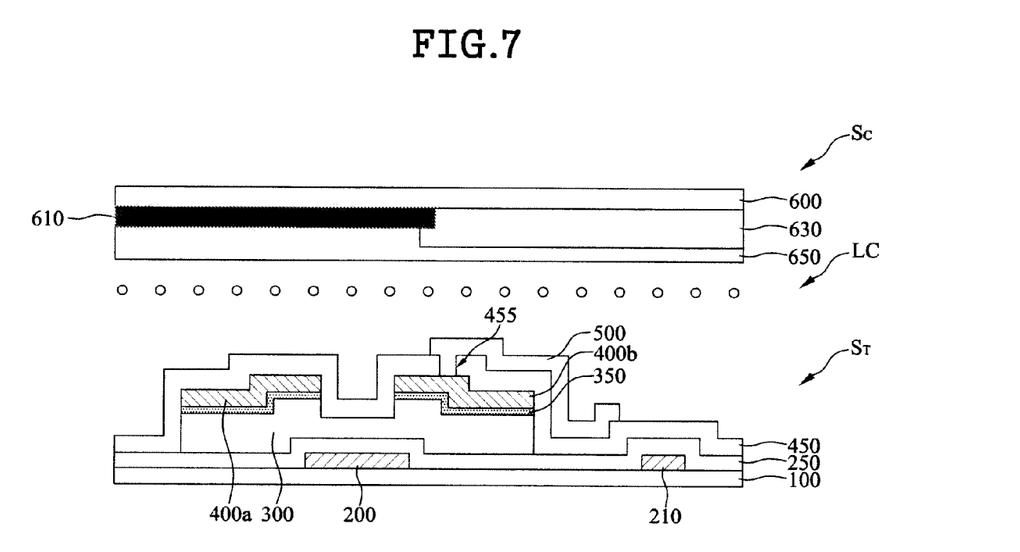
FIG. 7 is a cross section view illustrating an LCD device according to another embodiment of the present invention.

FIG. 7 is a cross section view illustrating an LCD device according to another embodiment of the present invention. Except that the thin film transistor substrate of FIG. 4 is applied, the LCD device according to another embodiment of the present invention is identical in structure to the aforementioned LCD device shown in FIG. 6.

On a thin film transistor substrate (ST), as shown in FIG. 7, there are a gate electrode 200, a gate insulating film 250, an active layer 300, an interface layer 350, a source electrode 400a, and a drain electrode 400b on a first substrate. Except that, the LCD device of FIG. 7 is identical to the LCD device of FIG. 6.

According to one embodiment of the present invention, the barrier layer 340 of the material containing Ge is formed between the ohmic contact layer 320 and the source electrode 400a, and between the ohmic contact layer 320 and the drain electrode 400b, to thereby improve the adhesive strength between the ohmic contact layer 320 and the source and drain electrodes 400a and 400b. In addition, the time consumed for the etching process is shortened during the process for forming the barrier layer 340, thereby improving the yield.

According to another embodiment of the present invention, the interface layer 350 of the material containing Ge is formed between the active layer 300 and the source electrode 400a, and between the active layer 300 and the drain electrode 400b, to thereby improve the adhesive strength between the active layer 300 and the source and drain electrodes 400a and 400b. In addition, the time consumed for the etching process is shortened during the process for forming the interface layer 350, thereby improving the yield. Also, the active layer 300 is thin so that the time consumed for the deposition process of the active layer 300 is shortened, whereby the current path is decreased due to the thin active layer 300, to thereby improve the device properties.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprises:
a substrate;
a gate electrode on the substrate;
a gate insulating film on the gate electrode;
an active layer on the gate insulating film;
an ohmic contact layer of doped amorphous silicon on the active layer;
an adhesive barrier layer on the ohmic contact layer, wherein the adhesive barrier layer is formed of GeC; and
a metal layer for a source electrode and a drain electrode directly on and contacting the adhesive barrier layer, wherein the source and drain electrodes are provided at a predetermined interval from each other, wherein the adhesive barrier layer of GeC is located between the metal layer for the source and drain electrodes and the ohmic contact layer of doped amorphous silicon,
wherein the adhesive barrier layer, the ohmic contact layer, and the source and drain electrodes are formed in the same pattern,
wherein the adhesive barrier layer is formed to have a thickness of about 100~500 Å,
wherein the source electrode and the adhesive barrier layer are formed in sequence by a wet-etching process, and the drain electrode and the adhesive barrier layer are formed in sequence by the wet-etching process, and
wherein a thickness of the active layer in a channel region between the source electrode and the drain electrode is smaller than a thickness of the active layer in other regions on the gate insulating layer.

2. The thin film transistor substrate of claim 1, wherein the metal layer for the source and drain electrodes is molybdenum (Mo), aluminum (Al), chrome (Cr), aurum (Au), titanium (Ti), nickel (Ni), neodymium (Nd), copper (Cu), or any alloy thereof.

3. An LCD device comprising:
first and second substrates; and
a liquid crystal layer between the first and second substrates,
wherein the first substrate is formed of a thin film transistor substrate comprising:
a substrate;
a gate electrode on the substrate;
a gate insulating film on the gate electrode;
an active layer on the gate insulating film;
an ohmic contact layer of doped amorphous silicon on the active layer;
an adhesive barrier layer on the ohmic contact layer, wherein the adhesive barrier layer is formed of GeC; and
a metal layer for a source electrode and a drain electrode directly on and contacting the adhesive barrier layer, wherein the source and drain electrodes are provided at a predetermined interval from each other, wherein the adhesive barrier layer of GeC is located between the metal layer for the source and drain electrodes and the ohmic contact layer of doped amorphous silicon,
wherein the adhesive barrier layer, the ohmic contact layer, and the source and drain electrodes are formed in the same pattern,
wherein the adhesive barrier layer is formed to have a thickness of about 100~500 Å,
wherein the source electrode and the adhesive barrier layer are formed in sequence by a wet-etching process, and the drain electrode and the adhesive barrier layer are formed in sequence by the wet-etching process, and
wherein a thickness of the active layer in a channel region between the source electrode and the drain electrode is smaller than a thickness of the active layer in other regions on the gate insulating layer.

4. The LCD device of claim 3, wherein the metal layer for the source and drain electrodes is molybdenum (Mo), aluminum (Al), chrome (Cr), aurum (Au), titanium (Ti), nickel (Ni), neodymium (Nd), copper (Cu), or any alloy thereof.

* * * * *